United States Patent
Chan et al.

(10) Patent No.: US 7,187,059 B2
(45) Date of Patent: Mar. 6, 2007

(54) COMPRESSIVE SIGE <110> GROWTH AND STRUCTURE OF MOSFET DEVICES

(75) Inventors: Kevin K. Chan, Staten Island, NY (US); Kathryn W. Guarini, Yorktown Heights, NY (US); Meikei Ieong, Wappinger Falls, NY (US); Kern Rim, Yorktown Heights, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 10/875,727

(22) Filed: Jun. 24, 2004

(65) Prior Publication Data

US 2005/0285159 A1    Dec. 29, 2005

(51) Int. Cl.
| | |
|---|---|
| H01L 29/04 | (2006.01) |
| H01L 31/036 | (2006.01) |
| H01L 29/06 | (2006.01) |
| H01L 31/0328 | (2006.01) |
| H01L 31/0336 | (2006.01) |

(52) U.S. Cl. .................... 257/628; 257/18; 257/19; 257/627; 257/750; 257/798

(58) Field of Classification Search ............ 257/18–19, 257/627–628, 750, 798
See application file for complete search history.

(56) References Cited

U.S. PATENT DOCUMENTS

| | | | | |
|---|---|---|---|---|
| 5,461,250 A | * | 10/1995 | Burghartz et al. ......... | 257/347 |
| 5,514,614 A | * | 5/1996 | Yuki et al. ................. | 438/141 |
| 5,528,719 A | * | 6/1996 | Yamada ..................... | 385/137 |
| 5,833,749 A | * | 11/1998 | Moritani et al. ........... | 117/101 |
| 6,008,128 A | * | 12/1999 | Habuka et al. ............ | 438/695 |
| 6,581,387 B1 | * | 6/2003 | Ullom ......................... | 62/3.1 |
| 6,841,274 B2 | * | 1/2005 | Ueno et al. ................ | 428/698 |
| 2002/0185686 A1 | * | 12/2002 | Christiansen et al. ...... | 257/347 |
| 2003/0012925 A1 | * | 1/2003 | Gorrell ...................... | 428/137 |
| 2004/0038082 A1 | * | 2/2004 | Tsumori ............... | 428/694 SG |
| 2004/0070051 A1 | * | 4/2004 | Sugiyama et al. ......... | 257/616 |
| 2005/0023601 A1 | * | 2/2005 | Takeuchi et al. ........... | 257/315 |
| 2005/0039670 A1 | * | 2/2005 | Hosono et al. ............ | 117/2 |
| 2005/0092235 A1 | * | 5/2005 | Brabant et al. ............ | 117/105 |
| 2005/0145941 A1 | * | 7/2005 | Bedell et al. ............... | 257/348 |

* cited by examiner

Primary Examiner—Ida M. Soward
(74) Attorney, Agent, or Firm—Robert M. Trepp

(57) ABSTRACT

A structure for conducting carriers and method for forming is described incorporating a single crystal substrate of Si or SiGe having an upper surface in the <110> and a psuedomorphic or epitaxial layer of SiGe having a concentration of Ge different than the substrate whereby the psedomorphic layer is under strain. A method for forming semiconductor epitaxial layers is described incorporating the step of forming a psuedomorphic or epitaxial layer in a rapid thermal chemical vapor deposition (RTCVD) tool by increasing the temperature in the tool to about 600° C. and introducing both a Si containing gas and a Ge containing gas. A method for chemically preparing a substrate for epitaxial deposition is described including the steps of immersing a substrate in a series of baths containing ozone, dilute HF, deionized water, HCL acid and deionized water, respectively, followed by drying the substrate in an inert atmosphere to obtain a substrate surface free of impurities and with a root mean square (RMS) surface roughness of less than 0.1 run.

9 Claims, 7 Drawing Sheets

COMPRESSIVE SIGE <110> GROWTH AND STRUCTURE OF MOSFET DEVICES

FIELD OF THE INVENTION

This invention relates to advance Complementary Metal Oxide Semiconductor (CMOS) transistor device design and material processing particularly to compressive strained SiGe material.

BACKGROUND

As CMOS transistor devices scale down, methods of improving circuit performance are increasingly important. One of the approaches in doing so is to enhance carrier mobilities in the channel region; i.e., increase in electron and hole mobility. This can be done by several methods:

1. Different Si lattice dimensions over a silicon substrate is used to obtain strain. Generally, strained-silicon on a relaxed SiGe buffer or strained-silicon on SOI (SSDOI) have shown electron mobility enhancement of about 2× on a N-FET and hole mobility enhancement of 50% on a P-FET at high Ge concentration SiGe alloy. It is largely due to silicon under biaxial tensile strain. However, most of this tensilely strained-Si consists of a high density of defects.

2. MOSFETs fabrication over different surface orientation silicon such as Si<110> substrate has shown ~1.5× hole mobility enhancement in P-FET but electron mobility from N-FET is degraded substantially. A hybrid orientation substrate was described by Min Yang at the IEDM 2003 which combined a Si <110> substrate and Si <100> substrate together, so that the P-FET is built on Si<110> for hole mobility enhancement and N-FET is built on Si<100> to maintain the N-FET performance.

There is a need for a solution to obtain both hole and electron carrier enhancement in CMOS.

SUMMARY OF INVENTION

The present invention provides a semiconductor material that has enhanced carrier mobilities that comprises a SiGe alloy layer having a <110> surface crystal orientation that is under a biaxial compressive strain. Biaxial compressive strain describes the net stress caused by longitudinal compressive stress and lateral compressive stress that is induced in the plane of the SiGe alloy layer during the growth of the semiconductor material.

Biaxial compressive strain may be formed in a SiGe layer by epitaxially forming the layer over a base layer or substrate having a smaller lattice spacing such as Si or SiGe where the Ge concentration is less than the Ge in the compressively strained layer thereover.

Biaxial tensile strain may be formed in a Si or SiGe layer by epitaxially forming the layer over a base layer or substrate having a larger lattice spacing such as SiGe where the Ge concentration is larger than the Ge in the tensilely strained layer thereover.

The semiconductor material of the present invention that includes a <110> surface orientation of SiGe alloy layer with biaxial compressive strain provides mobility enhancement for both N-MOS and P-MOS field effect transistors.

Another aspect of the present invention relates to a method of forming the semiconductor material of the present invention which the method of the present invention includes the steps of providing a silicon-germanium alloy <110> layer; with a biaxial compressive strain in this silicon-germanium alloy containing <110> layer.

In one embodiment, the SiGe alloy layer having the <110> surface orientation and biaxial compressive strain is fabricated by a method that comprises the following steps.

Preparing a Si or SiGe <110> substrate surface using 10 ppm Ozone in DI water at 23° C., dilute hydrofluoric acid 100:1 for 1 min, DI water rinse for 5 min, hydrochloric acid in DI water at 23° C., 1:100 in volume and finally DI water rinse for 5 min. Then warm above 30° C. in an inert atmosphere such as $N_2$, rinse and dry.

Next, forming an epitaxial crystal compressively-strained SiGe alloy layer on Si or SiGe <110> substrate, that was prepared with the above cleaning process, grown by Rapid Thermal Chemical Vapor Deposition System (RTCVD) using Silane and Germane gas, temperature in the range from 600° C. to 650° C., pressure equal to 20 Torr. In our case, compressively-strained 22% SiGe alloy should be below 20 nm in thickness by using Silane of 100 sccm, Germane of 40 sccm, temperature of 600° C. and pressure of 7 torr for 134 second. This SiGe layer is compressive strained or pseudomorphic on Si or SiGe <110> substrate. The surface roughness by AFM is below 0.2 nm and the defect density is in the range of device quality (below $5 \times 10^7$ defect/cm$^2$)

Further, an epitaxial crystal compressively-strained SiGe alloy layer on Si or SiGe <110> substrate may be grown in a Rapid Thermal Chemical Vapor Deposition system (RTCVD) built by Applied Materials Inc., Centura platform of HTF model. This system consists of 6 chambers; 2 loadlocks, 1 transfer chamber, 1 Rapid Thermal Anneal (RTA) chamber, 2 High Temperature Polysilicon (HTP) chambers. Compressively-strained SiGe alloy layer is grown in the HTP chamber in the range from 600C to 650C.

Further, CMOS devices may be formed on the epitaxial crystal compressively-strained SiGe alloy region with shallow trench isolation.

Further, CMOS devices with a high-K gate dielectric such as metal oxide, metal silicate, which has a dielectric constant higher than 3.9 may be formed on the epitaxial crystal compressively-strained SiGe alloy region with shallow trench isolation.

Further, CMOS devices with metallic gate and metal silicate may be formed on a gate dielectric or high-K dielectric on the epitaxial compressively-strained SiGe alloy region with shallow trench isolation.

BRIEF DRAWINGS

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
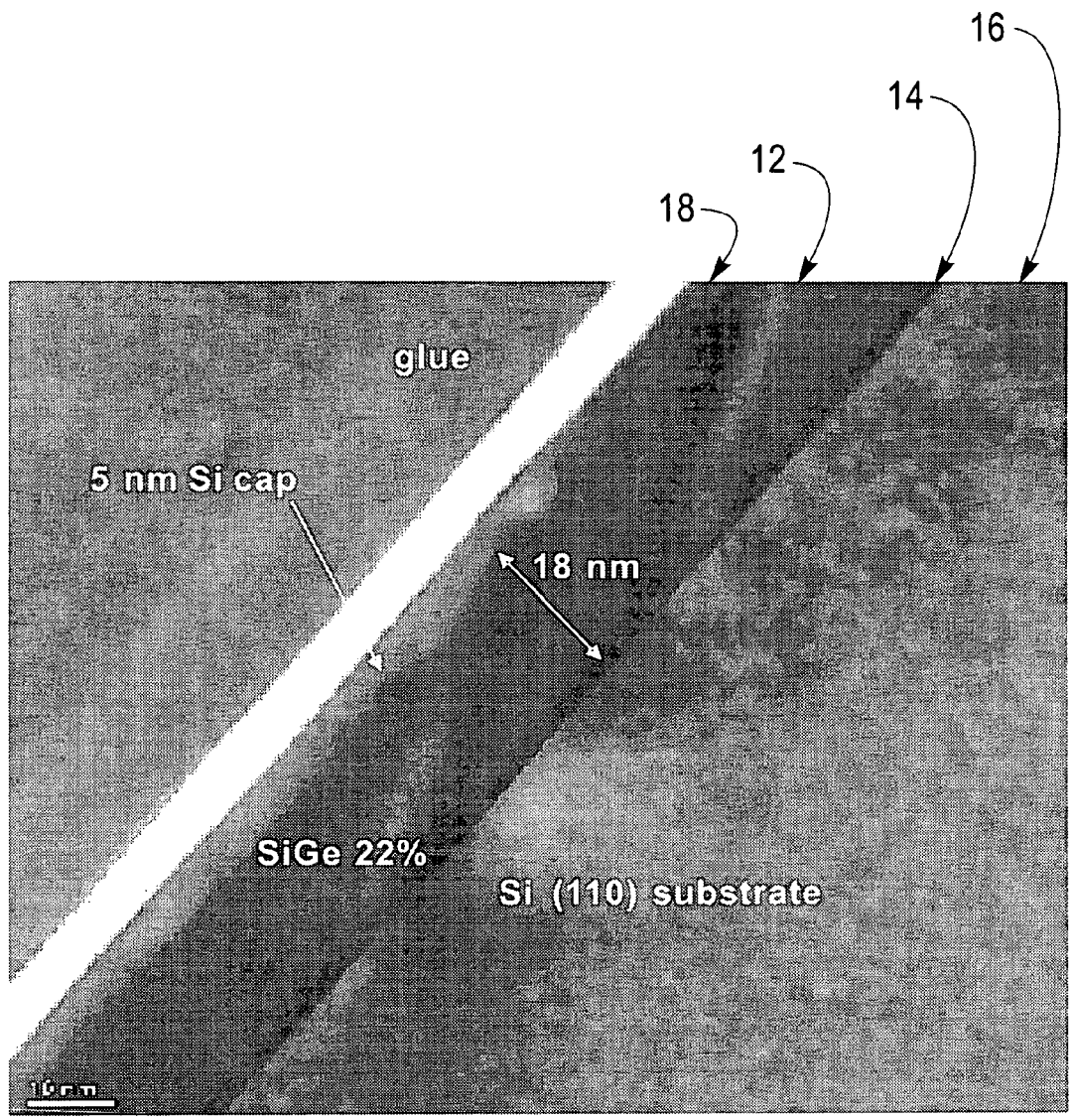
FIG. 1 shows a TEM micrograph of a 5 nm Si cap on a RTCVD grown 22% SiGe alloy layer on a (110) surface oriented silicon substrate.

Referring to the drawing and in particular to FIG. 1, a TEM micrograph shows a SiGe alloy layer 12 on a (110) surface 14 of single crystal silicon substrate 16. The Ge concentration in the SiGe alloy layer 12 is 22% which was grown by a rapid thermal chemical vapor deposition (RTCVD) process. The thickness of layer 12 is 18 nm. A cap layer 18 of Si having a thickness of 5 nm is grown over layer 12.

Figure 2:
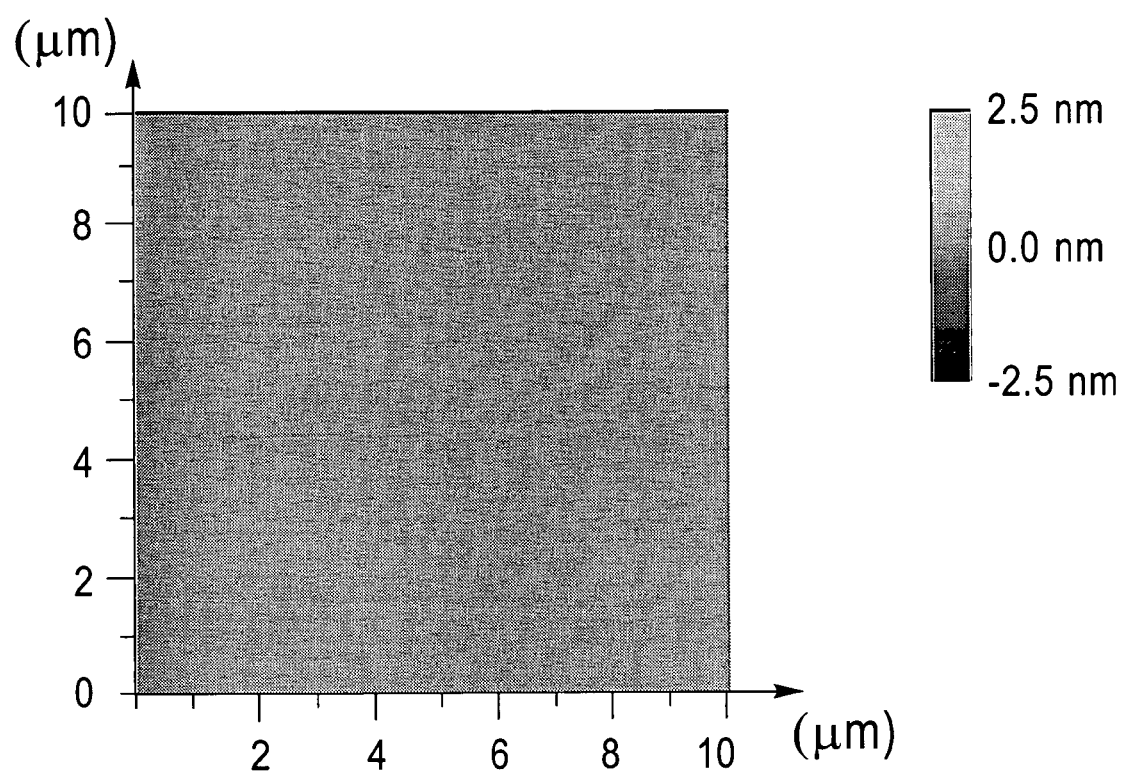
FIG. 2 shows an AFM image after a chemical preparation (cleaning) sequence for a Si <110> surface.

Prior to deposition of layer 12, upper surface 14 of substrate 16 was prepared chemically. FIG. 2 shows an Atomic Force Microscope (MM) image of a portion of surface 14 after chemical preparation. Chemical preparation comprised selecting a Si or SiGe substrate 16 having a surface roughness of less than 0.2 nm, immersing substrate 16 in a first bath of 10 PPM ozone in deionized water at 23° C., immersing substrate 16 in a second bath of dilute HF 100:1 for at least 1 minute, immersing substrate 16 in a third bath of deionized water for at least 5 minutes, immersing substrate 16 in a fourth bath of HCl acid and deionized water at least 1:100 at about 23° C., immersing substrate 16 in a fifth bath of deionized water for at least 5 minutes, and removing substrate 16 from the fifth bath to dry substrate 16 in an inert atmosphere containing for example nitrogen and at a temperature of at least 30° C. The surface roughness by root mean square (RMS) was equal to 0.109 nm and the Z range was equal to 1.174 nm which is comparable to an original Si <110> surface.

The SiGe epitaxial layer 12 may be formed comprising the steps of selecting a single crystal substrate 16 of Si or SiGe having an upper surface in the <110>, loading single crystal substrate 16 into a rapid thermal chemical vapor deposition tool, lowering a pressure in the tool below 0.2 Torr., increasing a temperature in the tool to about 600° C. and introducing both a Si containing gas for example silane and a Ge containing gas for example germane whereby a psuedomorphic layer of SiGe is formed over substrate 16 having a concentration of Ge different than said substrate whereby psuedomorphic layer 12 is strained.

Figure 3:
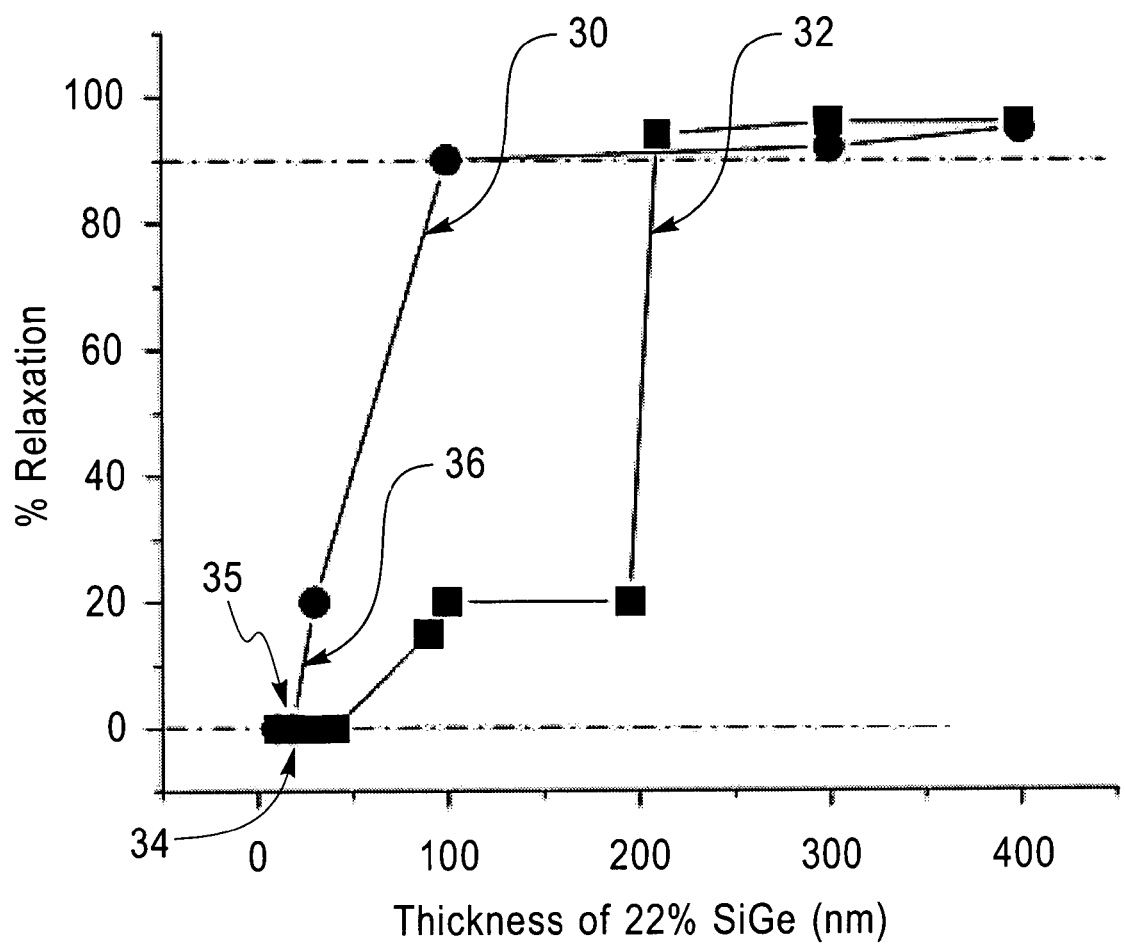
FIG. 3 shows curves of RAMAN analysis of SiGe 22% Ge on a (110) surface oriented silicon substrate below 20 nm in thickness which is compressively-strained or pseudomorphic.

FIG. 3 shows a RAMAN analysis of layer 12 as a function of thickness. In FIG. 3 the ordinate represents percentage of relaxation and the abscissa represents thickness in nm. Curve 30 has curve portion 34 where layer 12 is pseudomorphic and at point 35 of curve 30 begins the relaxation of layer 12. Curve portion 36 shows that the relaxation is rapid with thickness of layer 12. As long as layer 12 is below 20 nm, layer 12 remains pseudomorphic. Pseudomorphic refers to epitaxial or to the lattice matching and/or coherence to the substrate lattice. Thus the lattice spacing of SiGe at 22% is normally greater than Si and by being pseudomorphic is compressively strained. The lattice spacing in Si for 110 is 5.4 Angstroms in the x and y direction. The lattice spacing of Ge is 5.6 Angstroms in the x and y direction, about a 4% increase over Si. Alloys of SiGe have a lattice spacing as a linear function of the concentration of Si and Ge. Thus a 22% Ge concentration in SiGe results in a compressive strain of about 1% when layer 12 is psuedomorphic over <110> Si. The compression would be the same over <100> Si. Curve 32 shows relaxation of a SiGe layer <100> as a function of thickness.

Figure 4:
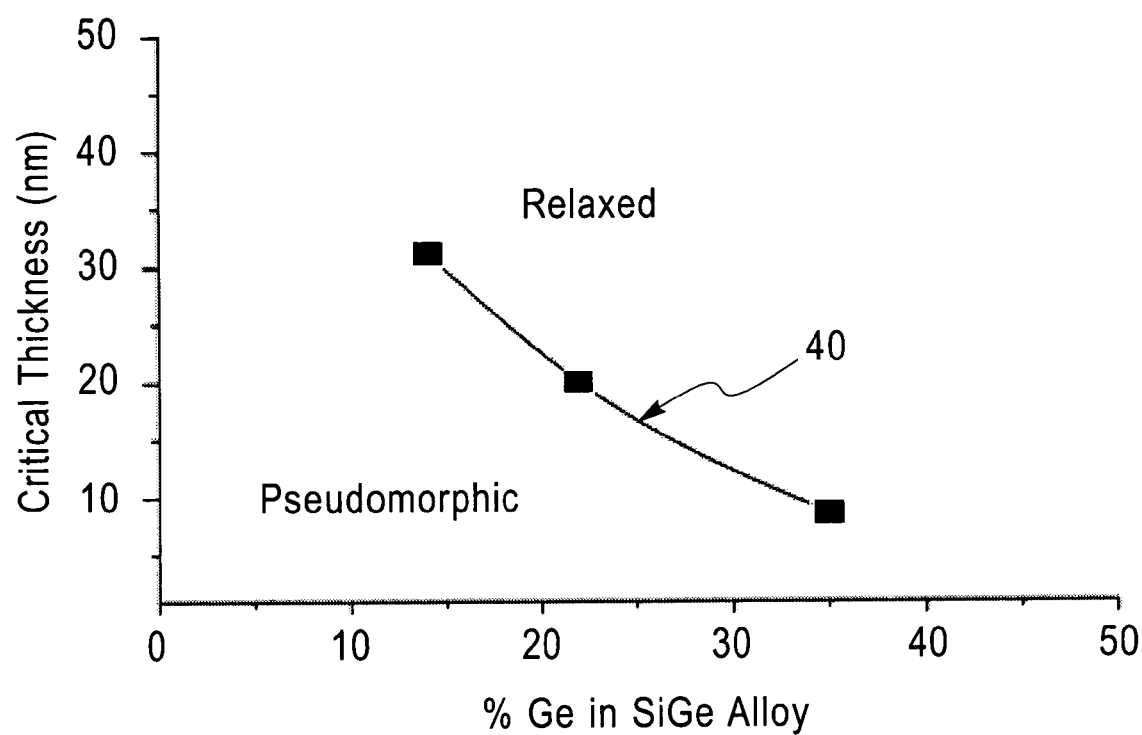
FIG. 4 shows a Critical Thickness curve for SiGe alloy on a (110) surface oriented silicon substrate.

FIG. 4, curve 40, shows the critical thickness of SiGe alloy on <110> surface oriented Si substrate. In FIG. 4, the ordinate represents critical thickness in run and the abscissa represents percentage of Ge in the SiGe alloy. In FIG. 4, layer 12 of SiGe having a thickness below curve 40 is psuedomorphic.

Figure 5:
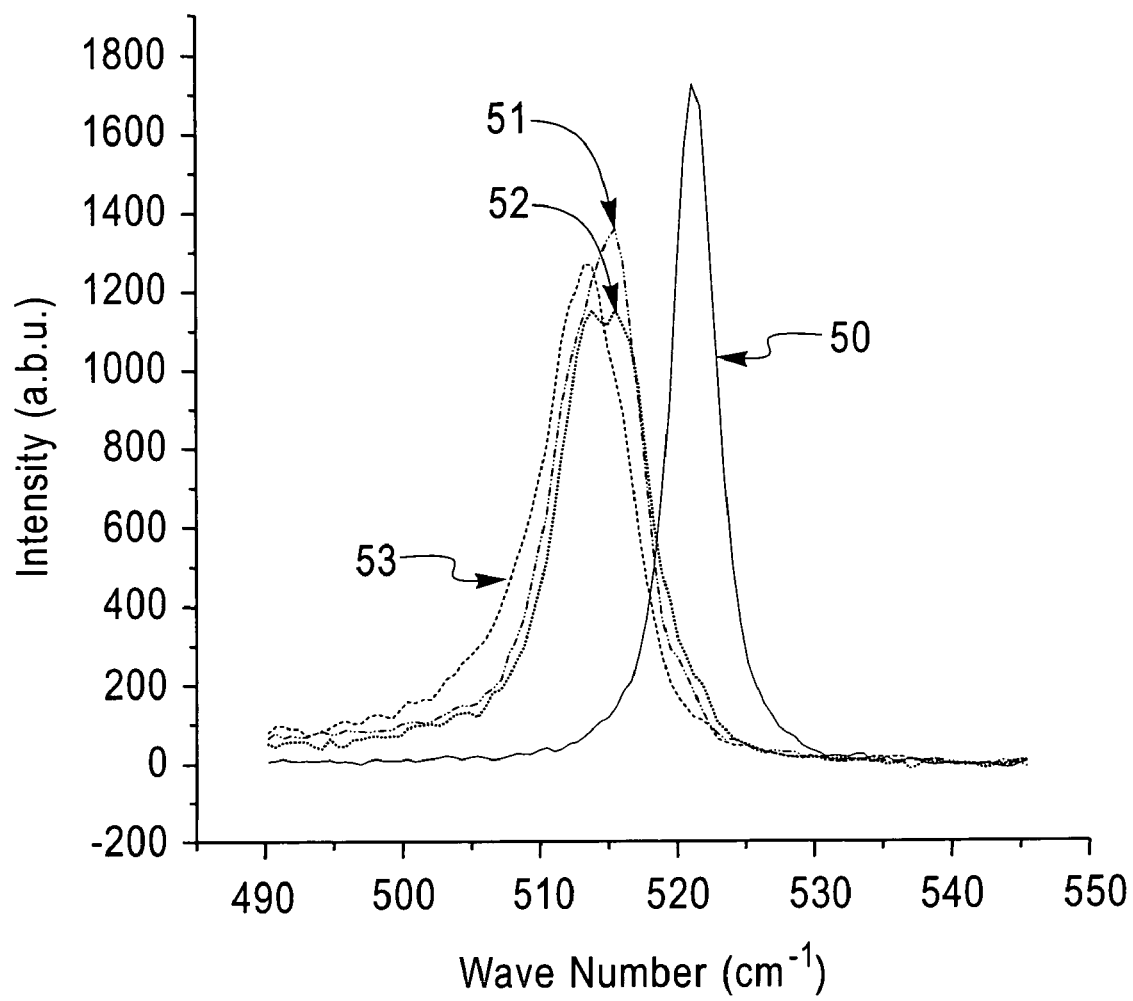
FIG. 5 shows Thermal stability of a 22% SiGe alloy layer on a (110) surface oriented silicon substrate by RAMAN analysis.

FIG. 5, curves 50–53, show the thermal stability of SiGe alloy layer 12 by RAMAN analysis during fabrication of a MOSFET. In FIG. 5, the ordinate represents intensity in a.b.u. and the abscissa represents wave number in 1/cm. Lambda was equal to 325 nm. Curve 50 shows the wavenumber 520 1/cm of Si 110. Curve 51–53 shows the wave number of about 514 1/cm after thermal cycling by rapid thermal annealing (RTA) at 1000 degrees C. up to 400 sec. In FIG. 5, curves 51–53 show that layer 12 remained pseudomorphic during RTA at 1000 degrees C. No relaxation of layer 12 was observed during or after RTA.

Figure 6:
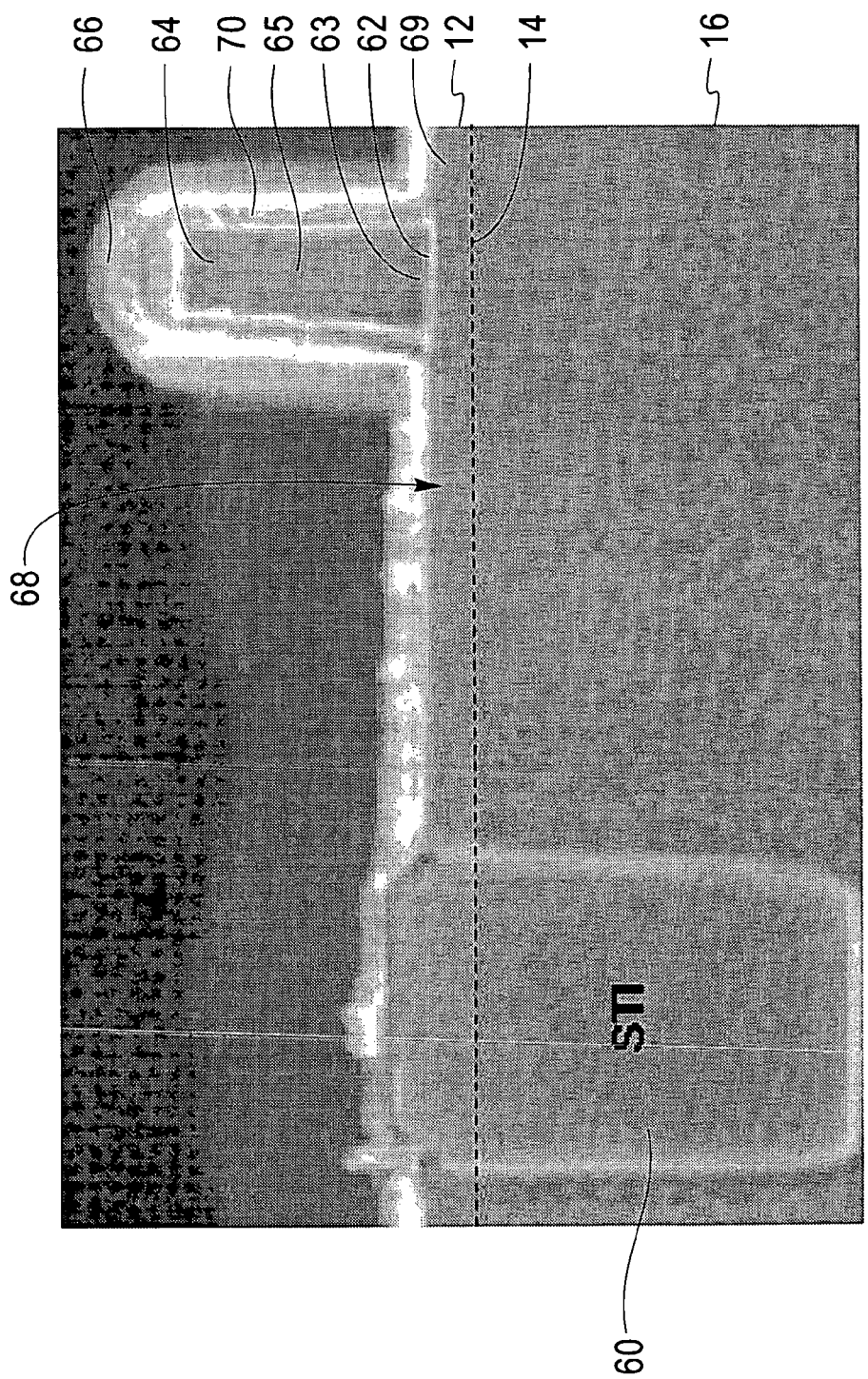
FIG. 6 shows a MOSFET fabricated on a compressively-strained 22% SiGe alloy layer on a (110) surface oriented silicon substrate.

FIG. 6 is a scanning microscope image of a MOSFET device fabricated upon compressively strained 22% SiGe alloy layer 12 on <110> surface 14 of Si substrate 16. Upper surface 14 of substrate 16 was first chemically prepared. Layer 12 was then fabricated on substrate 16. Next, a shallow trench isolation (STI) region 60 was formed in substrate 16 to provide electrical isolation of a MOSFET to be formed. Next a gate dielectric layer 62 was grown on layer 12. The gate dielectric layer 62 was N2O oxide about 2.5 nm thick. Gate dielectric layer 62 touches down to the SiGe alloy layer 12. There is less than 0.5 nm of cap layer 18 of Si left on SiGe alloy layer 12 underneath gate dielectric layer 62, meaning N2O oxide touches SiGe alloy layer 12. Next a polysilicon layer 64 was formed over the gate dielectric layer 62. Next, layer 64 and gate dielectric layer 62 was lithographically patterned by forming a mask and reactive ion etching (RIE) to form the gate dielectric 63 and gate electrode 65 of MOSFET 66. Next, the source 68 and drain 69 were formed by ion implantation using the gate for self alignment of the source and drain. Next, a sidewall spacer 70 was formed adjacent polysilicon gate 65.

Figure 7:
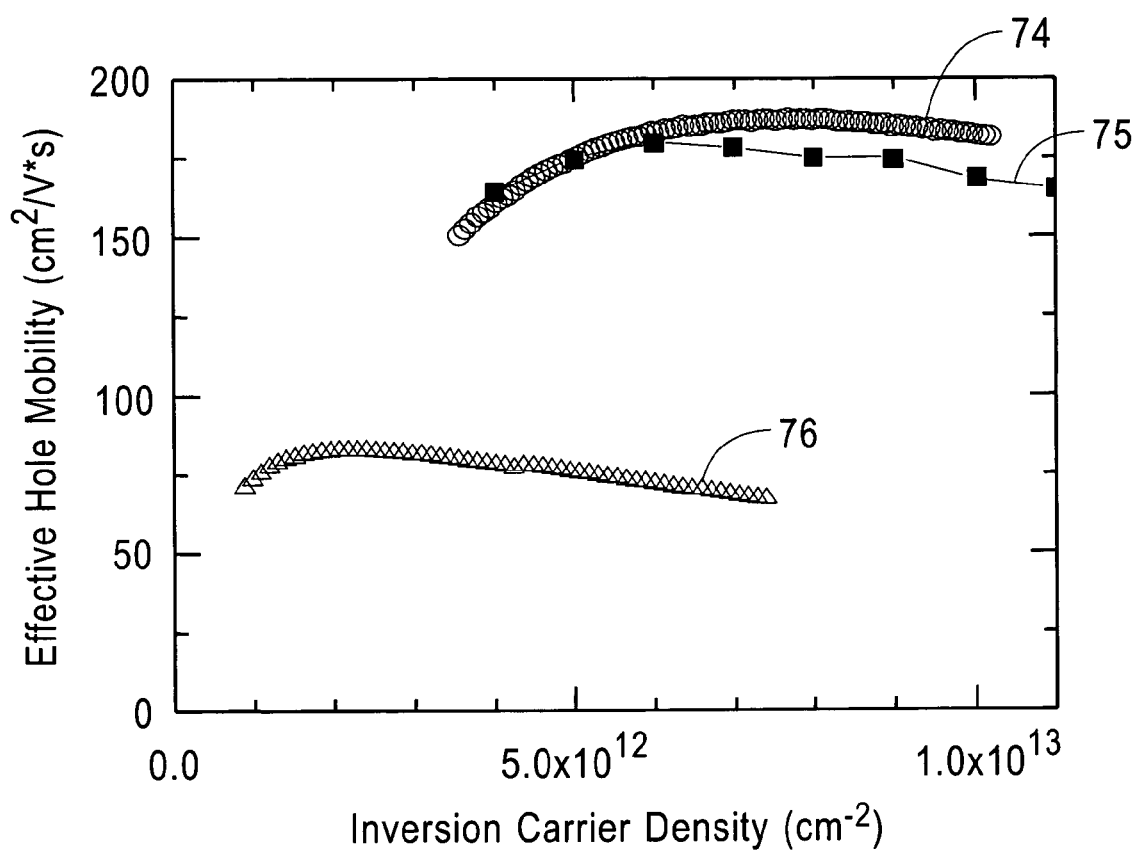
FIG. 7 shows a graph of hole mobility vs inversion charge showing that hole mobility on a 22% SiGe layer <110> is about 10 to 15% higher than Si <110> reported by Min Yang in IEDM, 2003 and about 180% higher than a Si layer <100>, a control layer.

FIG. 7 is a graph of the effective hole mobility versus inversion carrier density. In FIG. 7, the ordinate represents effective hole mobility in cm$^2$/Vsec and the abscissa represents inversion carrier density in 1/cm$^2$. Curve 74 is a plot of the hole mobility in layer 12, the channel of MOSFET 66 shown in FIG. 6. The hole mobility measured and then plotted to form curve 74 is approximately 10 percent higher than the hole mobility of Si <110> shown in curve 75. The hole mobility in curve 75 is about 180% higher than the hole mobility of Si <100> plotted in curve 76.

While there has been described and illustrated
1. a MOSFET device containing a pseudomorphic SiGe channel layer on a Si <110> substrate,
2. a method of forming a pseudomorphic SiGe layer by RTCVD and
3. a method of chemically preparing a silicon surface prior to RTCVD, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A structure for conducting:
    a single crystal substrate of Si or SiGe having an upper surface in the <110>, said substrate surface has an RMS of about 0.1 nm, and
    a psuedomorphic layer of SiGe formed over said substrate having a higher concentration of Ge than said substrate whereby said psuedomorphic layer is compressively strained.

2. The structure of claim wherein said psuedomorphic layer of SiGe has a thickness less than 20 nm.

3. The structure of claim 1 further comprising a gate dielectric over said psuedomorphic layer.

4. The structure of claim 3 further comprising gate electrode over said gate dielectric.

5. The structure of claim 3 further comprising a source and drain region formed in said pseudomorphic layer on either side of said gate dielectric to form a channel therebetween.

6. The structure of claim 3 further comprising a polysilicon gate electrode over said gate dielectric to form a MOSFET.

7. The structure of claim 3 further comprising a polysilicon germanium gate electrode over said gate dielectric.

8. The structure of claim 3 further comprising one of a metal and metal silicide gate electrode over said gate dielectric.

9. The structure of claim 3 wherein said gate dielectric has a dielectric constant greater than 3.9.

* * * * *